United States Patent
Bourstein et al.

(10) Patent No.: US 10,295,740 B2
(45) Date of Patent: May 21, 2019

(54) INTEGRATING SILICON PHOTONICS AND LASER DIES USING FLIP-CHIP TECHNOLOGY

(71) Applicant: Mellanox Technologies, Ltd., Yokneam (IL)

(72) Inventors: Ido Bourstein, Pardes Hana-Karkur (IL); Sylvie Rockman, Zichron Yaakov (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 15/633,799

(22) Filed: Jun. 27, 2017

(65) Prior Publication Data

US 2018/0011248 A1 Jan. 11, 2018

Related U.S. Application Data

(60) Provisional application No. 62/359,225, filed on Jul. 7, 2016.

(51) Int. Cl.
| | |
|---|---|
| *G02B 6/122* | (2006.01) |
| *H01S 5/022* | (2006.01) |
| *H01S 5/024* | (2006.01) |
| *G02B 6/42* | (2006.01) |
| *H01S 5/042* | (2006.01) |
| *G02B 6/12* | (2006.01) |
| *H01S 5/40* | (2006.01) |

(52) U.S. Cl.
CPC ............ *G02B 6/122* (2013.01); *H01S 5/0224* (2013.01); *H01S 5/02252* (2013.01); *H01S 5/02469* (2013.01); *G02B 6/428* (2013.01); *G02B 2006/12061* (2013.01); *H01S 5/02272* (2013.01); *H01S 5/0425* (2013.01); *H01S 5/4025* (2013.01)

(58) Field of Classification Search
CPC ... G02B 6/428; H01S 5/0224; H01S 5/02248; H01S 5/02252; H01S 5/02469; H01S 5/02476; H01L 24/81
See application file for complete search history.

(56) References Cited

U.S. PATENT DOCUMENTS

| | | | | |
|---|---|---|---|---|
| 5,675,684 A | * | 10/1997 | Hirataka | G02B 6/4232 385/88 |
| 6,049,639 A | | 4/2000 | Paniccia et al. | |

(Continued)

*Primary Examiner* — Robert Tavlykaev
(74) *Attorney, Agent, or Firm* — Kligler & Associates

(57) ABSTRACT

An optoelectronic device includes an optoelectronic die, a laser die, and electrical interconnects. The optoelectronic device has a surface. A trench having first and second walls and a floor is formed in the surface, and an electrically conductive layer extends from the floor, via the first wall, to the surface. The laser die includes first and second electrodes and a laser output aperture. The laser die is mounted in the trench and is configured to emit a laser beam. The first electrode is coupled to the electrically conductive layer and the laser output aperture is mechanically aligned with a waveguide that extends from the second wall. The interconnects are formed on the second electrode of the laser die and on selected locations on the surface of the optoelectronic die. The interconnects are coupled to a substrate, and are configured to conduct electrical signals between the optoelectronic die and the substrate.

17 Claims, 2 Drawing Sheets

(56) References Cited

U.S. PATENT DOCUMENTS

| | | | |
|---|---|---|---|
| 7,213,978 B2* | 5/2007 | Kuhmann | G02B 6/423 |
| | | | 385/52 |
| 7,349,614 B2 | 3/2008 | Doan | |
| 8,283,683 B2* | 10/2012 | Tsai | H01L 33/0079 |
| | | | 257/95 |
| 8,373,259 B2 | 2/2013 | Kim et al. | |
| 8,805,129 B2* | 8/2014 | Han | G02B 6/423 |
| | | | 385/129 |
| 8,855,160 B2* | 10/2014 | Adachi | H01S 5/18 |
| | | | 372/108 |
| 9,543,736 B1* | 1/2017 | Barwicz | H01S 5/02272 |
| 9,882,073 B2* | 1/2018 | Krasulick | H01L 31/02327 |
| 2005/0058408 A1* | 3/2005 | Colgan | G02B 6/4214 |
| | | | 385/89 |
| 2009/0087137 A1 | 4/2009 | Doan | |
| 2010/0215314 A1 | 8/2010 | Lau et al. | |
| 2014/0264400 A1 | 9/2014 | Lipson et al. | |
| 2015/0333481 A1 | 11/2015 | Thourhout et al. | |
| 2016/0268770 A1* | 9/2016 | Tazawa | H01S 5/0092 |
| 2017/0331248 A1* | 11/2017 | Lambert | G02B 6/136 |

* cited by examiner

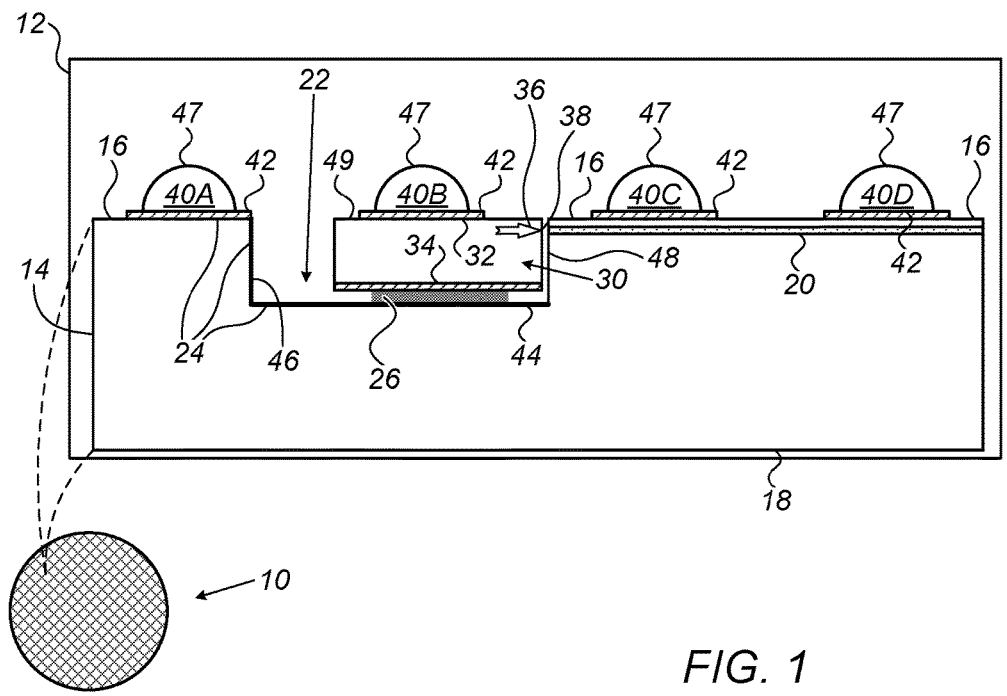
FIG. 1
FIG. 2
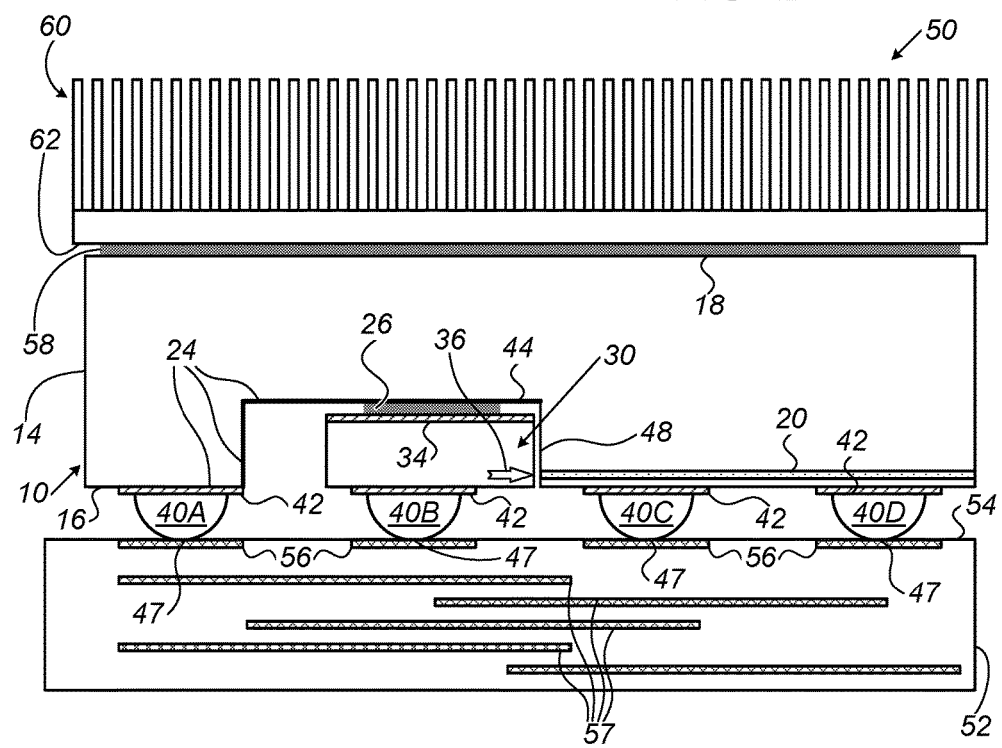

INTEGRATING SILICON PHOTONICS AND LASER DIES USING FLIP-CHIP TECHNOLOGY

CROSS-REFERENCE TO RELATED APPLICATIONS

This application claims the benefit of U.S. Provisional Patent Application 62/359,225, filed Jul. 7, 2016, whose disclosure is incorporated herein by reference.

FIELD OF THE INVENTION

The present invention relates generally to optoelectronic devices, and particularly to methods and systems for assembling integrated optoelectronic devices using flip-chip techniques.

BACKGROUND OF THE INVENTION

Optoelectronic devices are used in optical communication systems and various other applications. Optoelectronic devices having various configurations, and various methods for producing such optoelectronic devices, are known in the art.

For example, U.S. Patent Application Publication 2009/0087137 describes planar light-wave circuits with air filled trenches. An air filled trench is formed underneath the waveguide to reduce propagation loss, which in turn allows the waveguide to be in the close proximity of on-chip devices, such as a photodetector. The air filled trench is formed from the back side of the substrate.

U.S. Patent Application Publication 2014/0264400 describes techniques, systems, and devices to provide multilayer platforms for integrating semiconductor integrated circuit dies, optical waveguides and photonic devices to provide intra-die or inter-die optical connectivity.

U.S. Pat. No. 6,049,639 describes a method and an apparatus for providing optical input/output in an integrated circuit. Optical modulators and demodulators, which are coupled to integrated circuit input/output nodes, are disposed on or within the back-side semiconductor substrate of a flip-chip packaged integrated circuit.

U.S. Pat. No. 7,349,614 describes a method to form a VLSI-photonic heterogeneous system device. The method comprises providing an optical substrate comprising at least one passive optical component formed therein. An electronic substrate is provided comprising at least one active electronic component formed therein. A plurality of metal pillars is formed through the optical substrate and protruding out a first surface of the optical substrate.

SUMMARY OF THE INVENTION

An embodiment of the present invention that is described herein provides an optoelectronic device including an optoelectronic die, a laser die, and electrical interconnects. The optoelectronic device has a surface. A trench having first and second walls and a floor is formed in the surface, and an electrically conductive layer extends from the floor, via the first wall, to the surface. The laser die includes first and second electrodes and a laser output aperture. The laser die is mounted in the trench and is configured to emit a laser beam. The first electrode is coupled to the electrically conductive layer, and the laser output aperture is mechanically aligned with a waveguide that extends from the second wall. The electrical interconnects are formed on the second electrode of the laser die and on selected locations on the surface of the optoelectronic die, the electrical interconnects are coupled to a substrate, and are configured to conduct electrical signals between the optoelectronic die and the substrate.

In some embodiments, the optoelectronic device includes a heat sink coupled to an opposite surface of the optoelectronic die, which is opposite the surface having the trench, and is configured to conduct heat from the optoelectronic die. In other embodiments, the optoelectronic die includes a silicon photonics (SiP) die. In yet other embodiments, the electrical interconnects are formed on the electrically conductive layer.

In an embodiment, the first electrode is soldered to the electrically conductive layer on the floor of the trench. In another embodiment, one or more of the electrical interconnects include interconnect types selected from a list consisting of bumps, ball grid array (BGA), array of bumps, or a combination thereof, and the electrical interconnects are coupled to the substrate using a flip-chip process. In yet another embodiment, a first distance between the surface of the optoelectronic die and the floor of the trench, matches a second distance between the first and second electrodes of the laser die, such that the second electrode is flush with the surface of the optoelectronic die.

In some embodiments, the electrical interconnects include first electrical interconnects, configured to conduct first electrical signals between the laser die and the substrate, and second electrical interconnects, configured to conduct second electrical signals between the optoelectronic die and the substrate.

There is additionally provided, in accordance with an embodiment of the present invention, a method for producing an optoelectronic device. The method includes forming, in a surface of a wafer, a trench having first and second walls and a floor, and depositing an electrically conductive layer that extends from the floor, via the first wall, to the surface. A laser die that includes first and second electrodes and a laser output aperture is mounted in the trench. The first electrode is coupled to the electrically conductive layer, and the laser output aperture is mechanically aligned with a waveguide that extends from the second wall. Electrical interconnects are formed on the second electrode of the laser die and on selected locations on the surface of the wafer. The electrical interconnects are coupled to a substrate.

There is further provided, in accordance with an embodiment of the present invention, a device that includes a carrier die, an embedded die, and electrical interconnects. The carrier die has a surface. A trench having first and second walls and a floor is formed in the surface, and an electrically conductive layer extends from the floor, via the first wall, to the surface. The embedded die includes at least first and second terminals. The embedded die is mounted in the trench. The first terminal is coupled to the electrically conductive layer. The electrical interconnects are formed on the second terminal of the embedded die and on selected locations on the surface of the carrier die. The electrical interconnects are coupled to a substrate, and are configured to conduct electrical signals between the carrier die and the substrate.

In some embodiments, the carrier die includes a microelectromechanical system (MEMS), and the embedded die includes a driver of the MEMS. In other embodiments, the electrical interconnects include first electrical interconnects, configured to conduct first electrical signals between the embedded die and the substrate, and second electrical interconnects, configured to conduct second electrical signals between the carrier die and the substrate. In yet other embodiments, one or more of the electrical interconnects include interconnect types selected from a list consisting of bumps, ball grid array (BGA), array of bumps, or a combination thereof, and the electrical interconnects are coupled to the substrate using a flip-chip process.

The present invention will be more fully understood from the following detailed description of the embodiments thereof, taken together with the drawings in which:

BRIEF DESCRIPTION OF THE DRAWINGS

FIG. 1 is a schematic, sectional view of an optoelectronic device formed on a silicon photonics (SiP) die, and a laser die assembled inside a trench in the SiP die, in accordance with an embodiment of the present invention;

FIG. 2 is a schematic, sectional view of an integrated optoelectronic device, in accordance with an embodiment of the present invention.

DETAILED DESCRIPTION OF EMBODIMENTS

Overview

Figure 3:
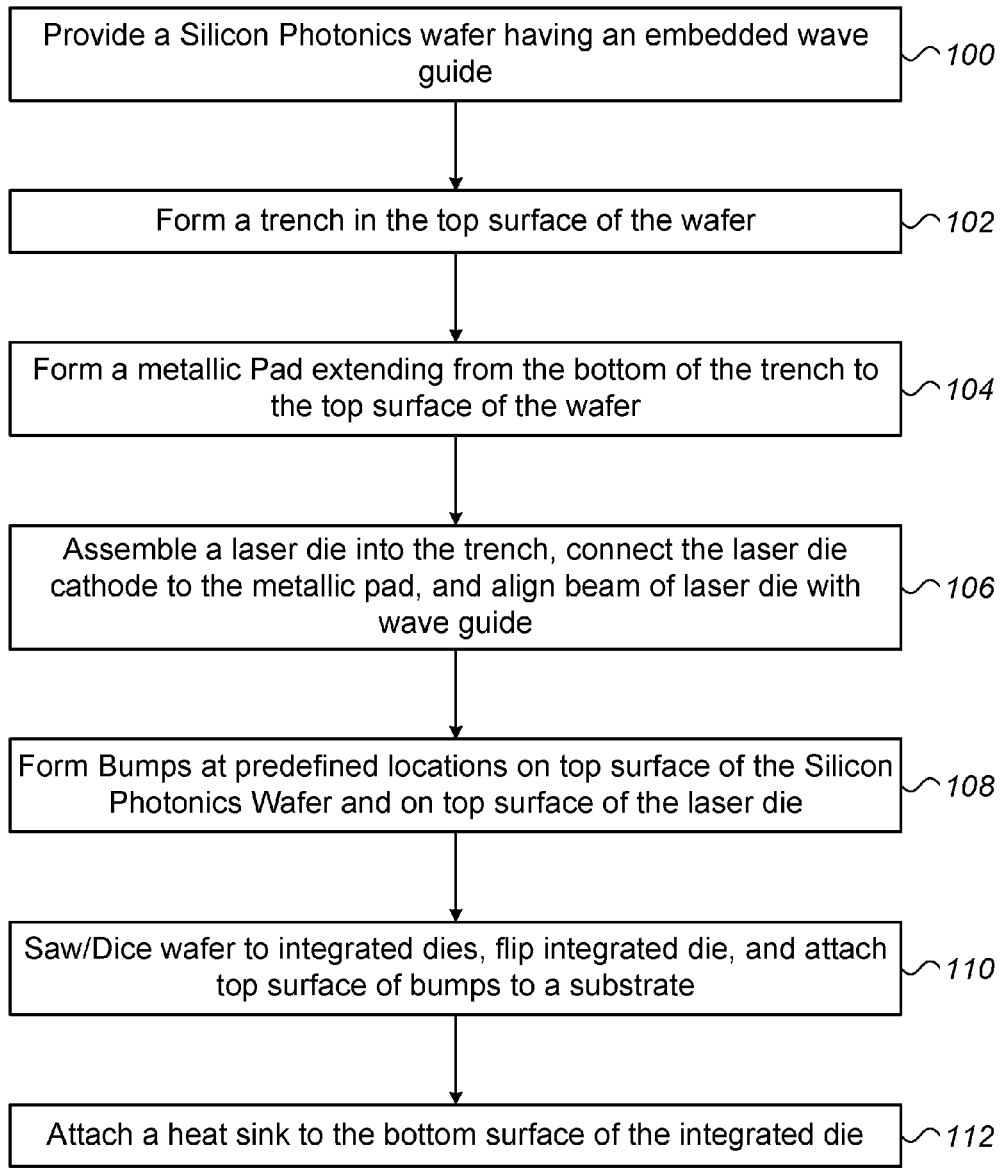
FIG. 3 is a flow chart that schematically illustrates a method for producing an optoelectronic device, in accordance with an embodiment of the present invention.

Integrated optoelectronic devices, such as Silicon Photonics (SiP) devices, typically comprise active and passive optical and electronic components. In principle, the optical and electrical components may be connected to one another and/or to a common substrate, for example, by wire bonding. In some cases, however, wire bonding may limit the electrical performance of the optoelectronic device, e.g., degrade signal integrity and limit signal bandwidth.

Embodiments of the present invention that are described hereinbelow provide techniques for improving electrical performance of a SiP device and increasing heat conductance from the optoelectronic device to the environment.

In some embodiments, an optoelectronic device comprises a SiP wafer having top and bottom surfaces opposing one another, and a trench formed in the top surface. The trench has first and second sidewalls opposing one another, and a floor. The optoelectronic device further comprises an electrically conductive layer that extends from the floor of the trench, via the second sidewall, to the top surface of the wafer.

In some embodiments, a laser diode, also referred to herein as a "laser die", which is configured to emit one or more laser beams, comprises an anode, a cathode, and a laser output aperture. The laser die is mounted in the trench, such that the cathode is coupled to the electrically conductive layer, the laser output aperture is mechanically aligned with a waveguide that extends from the first sidewall of the trench, and a top surface of the laser die is flush with the top surface of the wafer.

In some embodiments, the optoelectronic device comprises solder bumps, formed on the electrically conductive layer and on conductive pads deposited at selected locations on the top surface of the wafer.

In some embodiments, a grid of bumps, such as solder bumps, is formed on the top surfaces of the wafer and laser die. The bumps may be formed on both surfaces in a single process step, or in separate steps.

In some embodiments, after forming the bumps (and optionally additional processes), the SiP wafer is diced to form multiple individual integrated SiP dies, each SiP die having a respective laser die integrated therein. In the present context, the terms "SiP integrated dies", "integrated SiP dies" or "SiP dies" are used interchangeably.

In an embodiment, the optoelectronic device comprises a substrate, such as a printed circuit board (PCB), which is coupled to the SiP integrated die using flip-chip techniques, and is configured to exchange electrical signals with the SiP integrated die. In this embodiment, the solder bumps are coupled to the PCB, and are configured to conduct the electrical signals between the SiP integrated die and the PCB.

In some embodiments, the optoelectronic device further comprises a heat sink, which is coupled to the bottom surface of the SiP integrated die, and is configured to conduct excessive heat away from the SiP integrated die.

By applying the structure described above using a flip-chip process, the disclosed techniques help to reduce intrinsic inductance and parasitic capacitance within the SiP device (also referred to herein as "integrated SiP device"), thereby improving the electrical performance of the optoelectronic device. Furthermore, using the heat sink and the bumps improves heat dissipation from heat generating components of the optoelectronic device, such as the laser die, to the environment.

System Description

FIG. 1 is a schematic, sectional view of an optoelectronic device formed on a silicon photonics (SiP) die 14 of a SiP wafer 10, in accordance with an embodiment of the present invention. In some embodiments, wafer 10 is made from silicon or other suitable materials, and is typically round having any suitable value of diameter, such as 4-8 inches.

In some embodiments, wafer 10 comprises multiple SiP dies produced in wafer-level and subsequently diced and packaged as separate dies.

In some embodiments, the formation of the configuration described in FIG. 1 is typically carried out in wafer-level. In other words, before dicing wafer 10 into individual dies.

Reference is now made to an inset 12, which is a cross-sectional view of SiP die 14 of wafer 10. In some embodiments, die 14 comprises a top surface 16 and a bottom surface 18, opposing surface 16.

Note that in the present context, the terms "top" and "bottom" are used only as identifiers to identify two opposing surfaces on wafer 10, and do not connote or mandate any actual physical orientation of wafer 10, or of a SiP device depicted in FIG. 2 below.

In some embodiments, one or more trenches, such as a trench 22, are formed in top surface 16, typically using patterning techniques of Very Large Scale Integrated circuits (VLSI) devices, such as photolithography and deep reactive ion etching (RIE). In other embodiments, trenches 22 may be formed using other techniques of plasma etching, ion-milling, sputter etching, mechanical forming, or any other suitable etching techniques.

In some embodiments, trench 22 comprises a floor 44, a left sidewall 46 and a right sidewall 48. Note that the terms "left" and "right" are merely identifiers for simplifying the identification of sidewalls 46 and 48 in the figure and do not connote or mandate any actual physical orientation of the sidewalls. Furthermore, in the present context, the terms "sidewall" and "wall" are used interchangeably.

In some embodiments, an electrically conductive layer is deposited on die 14 using any suitable deposition technique, such as sputtering and/or electroplating. The electrically conductive layer is then patterned so as to form a metal pad layer 24 that extends from floor 44, via left wall 46, to top surface 16.

In some embodiments, one or more laser dies, such as a laser die 30, are mounted in trench 22. In an embodiment, laser die 30 comprises a laser die, such as distributed feedback (DFB) laser or Fabry-Perot (FB) laser, directly modulated laser (DML) diode, or electro-absorption (EA) modulated DFB laser (EML), produced, for example, by Avago Broadcom (formerly Avago Technologies). In some embodiments, laser die 30 comprises an anode 32, and a cathode 34, and is configured to produce one or more laser beams, such as a laser beam 36, which is emitted from laser die 30, through a respective laser output aperture 38 and right wall 48, into an optical waveguide 20 of SiP die 14.

In these embodiments, an electrically-conductive solder layer 26 is applied to couple (physically and electrically) between cathode 34 and metal pad layer 24. Note that in these embodiments, beam is typically parallel to surface 16, and aperture 38 is mechanically aligned with waveguide 20.

In some embodiments, waveguide 20 is planar and formed in close proximity to surface 16. In other embodiments, waveguide 20 may have any other suitable shape and may be patterned within, or on one or more of the surfaces of die 14.

In an embodiment, die 14 comprises a SiP modulator (not shown), which is configured to modulate beam 36 emitted from laser die 30, or from any other light source mounted on die 14.

In some embodiments, die 14 comprises multiple electrical interconnects, such as bumps 40A, 40B, 40C and 40D, configured to electrically connect between die 14 and a substrate shown in FIG. 2 below. Bumps 40A . . . D are made from solder (referred to herein as "solder bumps") or from any other suitable conductive material, such as copper or a suitable metallic alloy.

In an embodiment, bumps 40A . . . D are formed on a pad made form a conductive layer 42, such as under bump metallization (UBM) layers, which electrically connect between bumps 40A . . . D and parts of die 14. For example, bump 40B is electrically connected to anode 32 of laser die 30, bump 40A is electrically connected to cathode 34, via layer (with or without layer 42), and bumps 40C and 40D are formed on surface 16. In this embodiment, bumps 40A and 40B are adapted to conduct electrical signals related to the operation of laser die 30, and bumps 40C and 40D are adapted to conduct electrical signals related to the operation of SiP components (e.g., waveguide 20) of die 14.

Note that it is important to maintain a top surface 47 of each bump 40A . . . D flush relative to one another, so as to enable exchanging electrical signals between all the respective parts of die 14 and the substrate shown in FIG. 2 bellow. In case top surface 47 of a given bump among bumps 40A . . . D is higher or lower (above specified) compared to one or more of its neighbor bumps, then, at least one of the bumps will be electrically disconnected from the substrate.

In some embodiments, a top surface 49 of laser die 30 is flush with surface 16 of die 14 by matching a thickness of laser die 30 with a depth of trench 22. For example, in case the thickness (e.g., distance between anode 34 and cathode 34) of laser die 30 is 150 µm, and the combined thickness of layers 24 and 26 is 4 µm, then, the depth (e.g., distance between surface 16 and floor 44) of trench 22 has to be 154 µm to enable the required flush.

In other embodiments, topographical differences between the respective parts of die 14 may be compensated by forming each bump among bumps 40A . . . D at a specified height that enables a flush among the top surfaces of bumps 40A . . . D.

In alternative embodiments, any other suitable types of electrical interconnects may be used, instead of, or in conjunction with, bumps 40A . . . D. For example, a ball grid array (BGA) or array of bumps or combination thereof.

In some embodiments, components described above, such as trenches 22, laser dies 30, waveguides 20, and bumps 40A . . . D, may be arranged in die 14 and in wafer 10 in various exemplary configurations described in the following embodiments.

In an embodiment, die 14 may comprise a single trench 22, having a single laser die 30 mounted therein, which comprises a single laser configured to emit a single beam 36 through a single waveguide 20.

In another embodiment, laser die 30 may comprise multiple lasers, each configured to emit a respective beam 36. In this configuration, die 14 may comprise multiple respective waveguides 20, such that each beam 36 is aligned with respective waveguide 20.

In yet another embodiment, a plurality of laser dies 30 are mounted in trench 22 parallel to one another. Each laser die 30 configured to emit one or more laser beams 36 that are parallel to one another, such that all laser beams 36 are emitted from die 14 through respective waveguides formed in parallel to one another. In this configuration, each anode 42, of a respective laser die 30, is electrically coupled to a respective anode bump, such as bump 40B. Yet, multiple (e.g. all) cathodes 34, of respective laser dies 30, may be electrically coupled to a common cathode bump, such as bump 40A. In this embodiment, layers 24 may be extended from each cathode 34 to the common bump (e.g., bump 40A).

In an alternative embodiment, die 14 may comprise multiple trenches 22, each trench may have one or more respective laser dies 30 mounted therein as described above. Note that in this configuration, two or more waveguides 20 extending from respective trenches 22, may not be parallel to one another, so as to emit laser beams 36 in multiple directions.

In other embodiments, one or more trenches 22 may be pre-formed, each, across wafer 10 using mechanical forming, or any other suitable etching technique. In these embodiments, trench 22 is common to multiple dies 14, and is cut during the dicing of wafer 10 into individual dies. This configuration enables reducing the production costs associated with etching deep (e.g., 154 µm) trenches using the VLSI processes described above.

The configurations described above are provided by way of example, for demonstrating an example system or device in which die 14 may be integrated and used. Alternatively, any other suitable configuration can also be used.

FIG. 2 is a schematic, sectional view of an integrated optoelectronic device 50, in accordance with an embodiment of the present invention. In some embodiments, device 50 is formed after dicing wafer 10 to individual dies, such as die 14. As can be seen in the figure, device 50 is entirely free of wire bonds. As such, the disclosed design enables the device to exchange high-speed signals with high signal integrity.

In some embodiments, device 50 comprises die 14 depicted in detail in FIG. 1 above. In the example of FIG. 2, die 14 is flipped upside down relative to the configuration shown in FIG. 1 above, so that bumps 40A . . . D formed on surface 16 are facing down and surface 18 is facing up. Note that the terms "up" and "down" are used only as identifiers to identify the position of two opposing surfaces on wafer 10, and do not connote or mandate any actual physical orientation of wafer 10, or of device 50.

In some embodiments, device 50 comprises a substrate 52, such as a printed circuit board (PCB), comprising electrically conductive pads 56 formed on a surface 54 and conductive traces 57.

In some embodiments, die 14 is mounted on substrate 52 by coupling surface 47 of bumps 40A . . . D to surface 54 using a flip-chip process. Note that bumps 40A . . . D are flush with one another so as to enable exchanging electrical signals between substrate 52 and devices mounted on, or formed in die 14. For example, exchanging, via bumps 40A . . . B, laser-related electrical signals between laser die 30 and substrate 52, and exchanging, via bumps 40C . . . D, SiP-related electrical signals between SiP parts, such as control circuitry (not shown) of waveguide 20, and substrate 52.

The term "flip-chip," also known as controlled collapse chip connection (C4), refers to a method for interconnecting devices, such as integrated circuits (IC) and SiP dies, to external circuitry, such as substrate 52, using bumps 40A . . . D formed onto pads, such as layers 24 and 42. In some embodiments, bumps 40A . . . D comprise solder bumps, prepared by depositing a solder material on a pad (e.g., layers 24 and 42) followed by a thermal annealing step to create the half-dome shape shown in FIG. 1 above. In other embodiments, bumps 40A . . . D are made from copper (or another suitable material), patterned using any suitable bump formation technique.

In some embodiments, die 14 is flipped upside down so as to bring solder bumps 40A . . . D down onto pads 56 of substrate 52. The solder material of bumps 40A . . . D is then melted to produce an electrical connection between bumps 40A . . . D and pads 56, by using any suitable bonding technique.

These techniques enable reducing the footprint of device 50 compared to traditional techniques such as wire bonding (WB). As described above, the disclosed design enables the device to exchange high-speed signals with high signal integrity. Furthermore, bumps 40A . . . D provide electrical interconnects shorter and thicker than WB, thereby improving conductance of excessive heat from die 14.

In some embodiments, device 50 further comprises a heat sink 60, which is coupled to surface 18 of die 14 by applying a thermal conductive paste 58, such as E20, or H70 pastes produced by Epotec, or any other suitable paste adapted to bond surface 18 to a bottom surface 62 of heat sink 60.

FIG. 3 is a flow chart that schematically illustrates a method for producing optoelectronic device 50, in accordance with an embodiment of the present invention. The methods begins with a wafer providing step 100, in which SiP wafer 100 having SiP components, such as waveguide 20 is provided. At a trench forming step 102, one or more trenches 22 are formed (e.g., etched) in top surface 16. In this embodiment, each trench 22 comprises floor 44, and left and right walls 46 and 48, respectively.

At a pad formation step 104, metal pad layer 24 is formed, e.g., by metal deposition and patterning. In an embodiment, layer 24 extends from floor 44, via left wall 46, to surface 16. At a laser die assembly step 106, one or more laser dies 30 are mounted in each trench 22, such that cathode 34 is connected via solder layer 26, to metal pad layer 24, aperture 38 is aligned with waveguide 20, and surface 49 of laser 30 is flush with surface 16 of die 14.

At a bumps formation step 108, one or more pads, made form a conductive layer 42, are formed at predefined locations on surface 16, and on surface 49 of laser die 30. In an embodiment, bumps 40A . . . D, such as solder bumps, are formed on layers 42 and 24. Note that top surface 47 of pads 40A . . . D are flush, so as to enable exchanging all the specified electrical signals between die 14 and substrate 52 (after performing the flip-chip process.)

At a flip-chip processing step 110, wafer 10 is diced and separated to single dies, such as die 14. In an embodiment, each die 14 is flipped, relative to the configuration shown in FIG. 1, and attached to substrate 52 by moving die 14 and substrate 52 towards one another, and coupling surface 47 of bumps 40A . . . D to pads 56 of substrate 52, using any suitable bonding technique.

In this embodiment, bumps 40A and 40B are adapted to conduct, via layers 24 and 42, respectively, electrical signals between laser die 30 and substrate 52. Furthermore, bumps 40C and 40D are adapted to conduct, via layer 42, electrical signals between SiP components mounted on die 14 and substrate 52. For example, bump 40C may interconnect between the SiP modulator of die 14 and a modulator driver (not shown), mounted on substrate 52.

At a heat sink attachment step 112, which is the last step of the method, heat sink 60 is attached to die 14 by applying thermal conductive paste 58 between surface 18 of die 14 and surface 62 of heat sink 60.

Although the embodiments described herein mainly address integrated optoelectronic devices comprising silicon photonics dies, the methods and systems described herein can also be used, mutatis mutandis, in other applications, such as in a device comprising any combination of integrated dies whose final assembly may be carried out using a flip-chip process.

In some embodiments, in an integrated device, SiP die 14 may be replaced by any suitable carrier die, and laser die 30 may be replaced by at least one suitable die embedded in trench 22. For example, in an integrated accelerometer, the carrier die may comprise a microelectromechanical system (MEMS) produced on a wafer and diced as described above, and an embedded device, such as a driver of the MEMS may be mounted in trench 22. Note that the embedded die (e.g., driver) comprises at least two electrodes or other terminals, such as electrodes 32 and 34 of laser die 30, and its top surface is typically flush with the top surface of the carrier die (e.g., MEMS). This configuration is important to maintain a top surface 47 of each bump 40A . . . D flush relative to one another in a flip-chip process.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. An optoelectronic device, comprising:
an optoelectronic die having a surface, wherein a trench having first and second walls and a floor is formed in the surface, and an electrically conductive layer extends from the floor, via the first wall, to the surface;

a laser die, comprising first and second electrodes and a laser output aperture, wherein the laser die is mounted in the trench and is configured to emit a laser beam, wherein the first electrode is coupled to the electrically conductive layer and wherein the laser output aperture is mechanically aligned with a waveguide that extends from the second wall;

one or more first electrical interconnects, which are formed on the second electrode of the laser die; and one or more second electrical interconnects, which are formed on the surface of the optoelectronic die outside the trench and are configured to conduct electrical signals to a substrate, wherein both the first electrical interconnects on the laser die, and the second electrical interconnects on the optoelectronic die, are situated on a same plane.

2. The device according to claim 1, and comprising a heat sink coupled to an opposite surface of the optoelectronic die, wherein the heat sink is opposite the surface having the trench, and is configured to conduct heat from the optoelectronic die.

3. The device according to claim 1, wherein the optoelectronic die comprises a silicon photonics (SiP) die.

4. The device according to claim 1, wherein the first electrode is soldered to the electrically conductive layer on the floor of the trench.

5. The device according to claim 1, wherein one or more of the first and second electrical interconnects comprise interconnect types selected from a list consisting of bumps, ball grid array (BGA), array of bumps, or a combination thereof, and wherein the first and second electrical interconnects are coupled to the substrate using a flip-chip process.

6. The device according to claim 1, wherein the first electrical interconnects are configured to conduct first electrical signals between the laser die and the substrate, and the second electrical interconnects are configured to conduct second electrical signals between the optoelectronic die and the substrate.

7. An optoelectronic device, comprising:
an optoelectronic die having a surface, wherein a trench having first and second walls and a floor is formed in the surface, and an electrically conductive layer extends from the floor, via the first wall, to the surface;

a laser die, comprising first and second electrodes and a laser output aperture, wherein the laser die is mounted in the trench and is configured to emit a laser beam, wherein the first electrode is coupled to the electrically conductive layer and wherein the laser output aperture is mechanically aligned with a waveguide that extends from the second wall;

one or more first electrical interconnects, which are formed on the second electrode of the laser die; and one or more second electrical interconnects, which are formed on the surface of the optoelectronic die outside the trench and are configured to conduct electrical signals to a substrate, wherein a first distance between the surface of the optoelectronic die and the floor of the trench, matches a second distance between the first and second electrodes of the laser die, such that the second electrode is flush with the surface of the optoelectronic die.

8. A method for producing an optoelectronic device, the method comprising:
forming, in a surface of a wafer, a trench having first and second walls and a floor, and depositing an electrically conductive layer that extends from the floor, via the first wall, to the surface;

mounting in the trench a laser die comprising first and second electrodes and a laser output aperture, wherein the first electrode is coupled to the electrically conductive layer and the laser output aperture is mechanically aligned with a waveguide that extends from the second wall;

forming one or more first electrical interconnects on the second electrode of the laser die;

forming one or more second electrical interconnects on the surface of the wafer outside the trench; and coupling the first and second electrical interconnects to a substrate.

9. The method according to claim 8, and comprising dicing the wafer and coupling an opposite surface of the diced wafer, which is opposite the surface having the trench, to a heat sink.

10. The method according to claim 8, wherein the wafer comprises an optoelectronic wafer.

11. The method according to claim 8, wherein mounting the laser die comprises soldering the first electrode to the electrically conductive layer on the floor of the trench.

12. The method according to claim 8, wherein one or more of the first and second electrical interconnects comprise interconnect types selected from a list consisting of bumps, ball grid array (BGA), array of bumps, or a combination thereof, and wherein coupling the first and second electrical interconnects to the substrate comprises coupling the first and second electrical interconnects to the substrate using a flip-chip process.

13. The method according to claim 8, wherein a first distance between the surface of the wafer and the floor of the trench, matches a second distance between the first and second electrodes of the laser die, such that the second electrode is flush with the surface of the wafer.

14. The method according to claim 8, wherein forming the first and second electrical interconnects comprises forming the first electrical interconnects for conducting first electrical signals between the laser die and the substrate, and the second electrical interconnects for conducting second electrical signals between the optoelectronic die and the substrate.

15. The method according to claim 8, wherein forming the first and second electrical interconnects comprises forming both the first electrical interconnects on the laser die, and the second electrical interconnects on the optoelectronic die, to be situated on a same plane.

16. The method according to claim 8, wherein forming the first and second electrical interconnects comprises forming each of the first electrical interconnects and each of the second electrical interconnects with a die-facing surface and a substrate-facing surface, and with substrate-facing surfaces of both the first and second electrical interconnects situated on a same plane facing the substrate.

17. An optoelectronic device, comprising:
an optoelectronic die having a surface, wherein a trench having first and second walls and a floor is formed in the surface, and an electrically conductive layer extends from the floor, via the first wall, to the surface;

a laser die, comprising first and second electrodes and a laser output aperture, wherein the laser die is mounted in the trench and is configured to emit a laser beam, wherein the first electrode is coupled to the electrically conductive layer and wherein the laser output aperture is mechanically aligned with a waveguide that extends from the second wall;

one or more first electrical interconnects, which are formed on the second electrode of the laser die; and one or more second electrical interconnects, which are formed on the surface of the optoelectronic die outside the trench and are configured to conduct electrical signals to a substrate, wherein each of the first electrical interconnects and each of the second electrical interconnects has a die-facing surface and a substrate-facing surface, and wherein substrate-facing surfaces of the first electrical interconnects and of the second electrical interconnects are situated on a same plane facing the substrate.

\* \* \* \* \*